United States Patent
Li

(10) Patent No.: US 8,760,925 B2
(45) Date of Patent: Jun. 24, 2014

(54) NON-VOLATILE SEMICONDUCTOR MEMORY DEVICE

(75) Inventor: Xu Li, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 13/599,186

(22) Filed: Aug. 30, 2012

(65) Prior Publication Data

US 2013/0229871 A1   Sep. 5, 2013

(30) Foreign Application Priority Data

Sep. 26, 2011   (JP) ................................. 2011-208476

(51) Int. Cl.
*G11C 16/04*   (2006.01)

(52) U.S. Cl.
USPC ............ 365/185.17; 365/185.11; 365/185.13; 365/185.18

(58) Field of Classification Search
USPC ................................................... 365/185.17
See application file for complete search history.

(56) References Cited

U.S. PATENT DOCUMENTS

| | | | |
|---|---|---|---|
| 7,558,141 B2 | 7/2009 | Katsumata et al. | |
| 7,876,618 B2 | 1/2011 | Lee et al. | |
| 7,936,004 B2 | 5/2011 | Kito et al. | |
| 7,982,260 B2 * | 7/2011 | Fukuzumi et al. | ............ 257/324 |
| 8,542,533 B2 * | 9/2013 | Maejima et al. | ......... 365/185.18 |
| 2008/0180994 A1 | 7/2008 | Katsumata et al. | |
| 2010/0118610 A1 | 5/2010 | Katsumata et al. | |
| 2010/0214838 A1 | 8/2010 | Hishida et al. | |
| 2011/0175159 A1 | 7/2011 | Itagaki et al. | |
| 2011/0235421 A1 * | 9/2011 | Itagaki et al. | ............ 365/185.17 |

FOREIGN PATENT DOCUMENTS

| | | |
|---|---|---|
| JP | 2007-266143 | 10/2007 |
| JP | 2008-171839 | 7/2008 |
| JP | 2010-80729 | 4/2010 |
| JP | 2010-118530 | 5/2010 |
| JP | 2010-199235 | 9/2010 |

* cited by examiner

*Primary Examiner* — Son Mai
(74) *Attorney, Agent, or Firm* — Oblon, Spivak, McClelland, Maier & Neustadt, L.L.P.

(57) ABSTRACT

Plural memory-strings are arranged in each memory-blocks, the memory-strings extending perpendicular to a substrate. Each memory-string includes plural memory-transistors and dummy-transistors connected in series. The drain-side select gate line and source-side select gate line are supplied with a voltage from the control circuit through the transfer-transistors when corresponding one of the memory blocks is selected. The drain-side select gate line and source-side select gate line are set in a floating state by the transfer-transistors that are rendered non-conductive when corresponding one of the memory-blocks is not selected. The dummy word-line is supplied with a voltage from the control circuit through a first transfer-transistor that are rendered conductive when corresponding memory block is selected. The dummy word-line is supplied with a voltage through a second transfer transistor different from the first transfer-transistor when corresponding memory-block is not selected.

17 Claims, 7 Drawing Sheets

| | SELECTED Block | | | NON-SELECTED Block | | |
|---|---|---|---|---|---|---|
| | Read | Program | Erase | Read | Program | Erase |
| $V_{SGD}[V]$ | 3 or 0 | 3 or 0 | 3 | f | f | f |
| $V_{D-CGD}[V]$ | Vread | Vpass | Vss | Vss | Vss | f |
| $V_{CGi}[V]$ | Vcgrv or Vread | Vpgm or Vpass | Vss | f | f | f |
| $V_{D-CGS}[V]$ | Vread | Vpass | Vss | Vss | Vss | f |
| $V_{SGS}[V]$ | 3 or 0 | 0 | 3 | f | f | f |

NON-VOLATILE SEMICONDUCTOR MEMORY DEVICE

CROSS REFERENCE TO RELATED APPLICATIONS

This application is based on and claims the benefit of priority from prior Japanese Patent Application No. 2011-208476, filed on Sep. 26, 2011, the entire contents of which are incorporated herein by reference.

FIELD

The embodiments described in the present specification relate to a non-volatile semiconductor memory device.

BACKGROUND

In recent years, in order to improve a degree of memory integration, a number of semiconductor memory devices (stacked non-volatile semiconductor memory devices) including three-dimensionally arranged memory cells have been proposed.

Conventional semiconductor memory devices including the three-dimensionally arranged memory cells have a problem that the number of transfer transistors is increased and the area of the peripheral circuits is increased.

DETAILED DESCRIPTION

Figure 1:
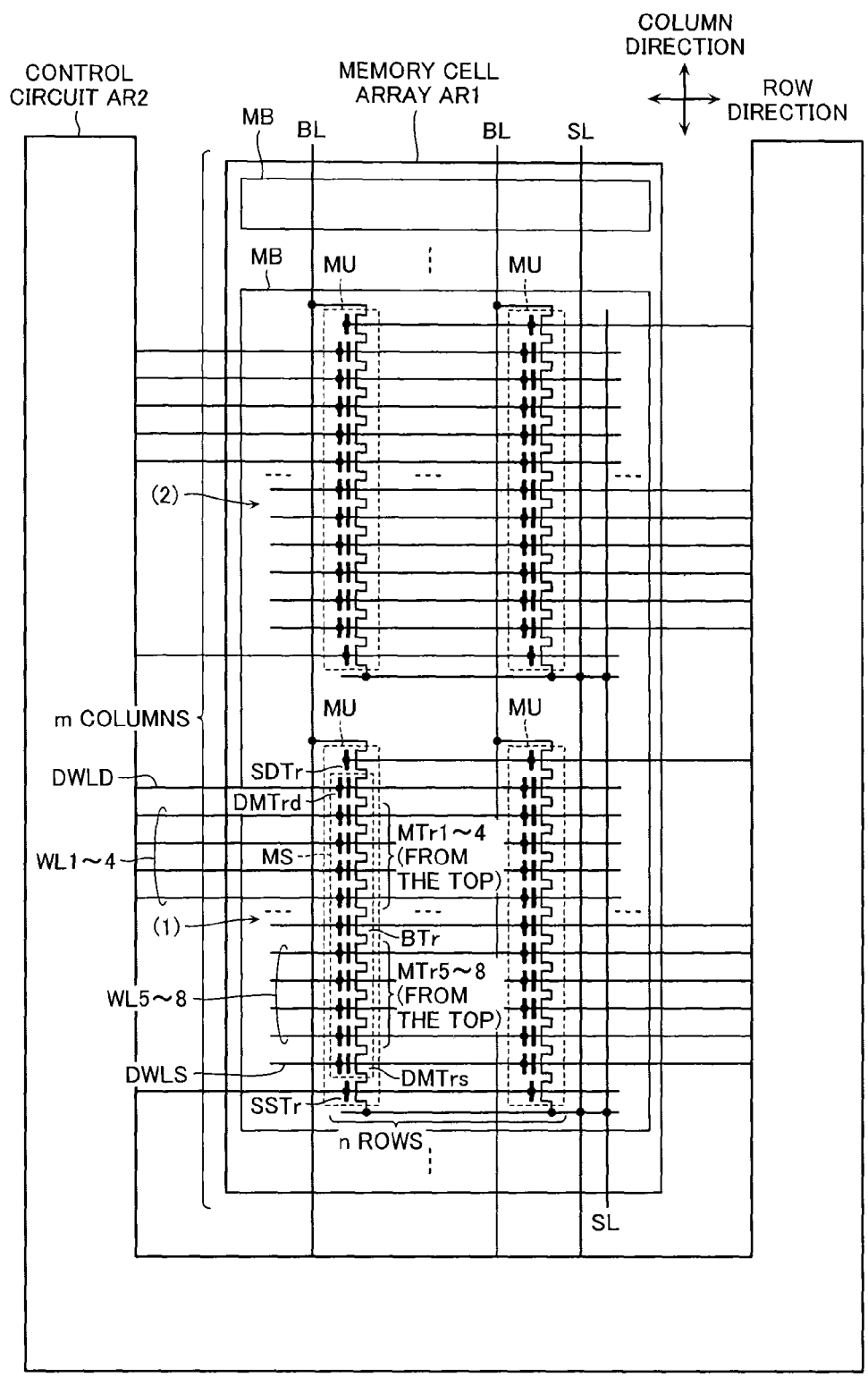
FIG. 1 is a circuit diagram showing the entire configuration of a non-volatile semiconductor memory device according to a first embodiment.

Non-volatile semiconductor memory devices according to the embodiments described below include a memory cell array including a plurality of memory blocks. A plurality of memory strings are arranged in each of the memory blocks, the memory strings extending in a direction perpendicular to a substrate. Each memory string includes a plurality of memory transistors and dummy transistors connected in series.

A drain-side select transistor has a first end connected to a first end portion of each of the memory strings. A source-side select transistor has a first end connected to a second end portion of each of the memory strings. A plurality of word lines are provided, each word line being commonly connected to the memory strings disposed in one of the memory blocks. A plurality of bit lines are provided. Each of the bit lines is connected to second ends of the drain-side select transistors present in the memory blocks. A source-lines is connected to a second end of the source-side select transistor.

A drain-side select gate line is commonly connected to the gates of the drain-side select transistors. A source-side select gate line is commonly connected to the gates of the source-side select transistors. A dummy word line is provided, the dummy word-ling being commonly connected to a plurality of dummy transistors included in one of the memory blocks. Transfer transistors are provided, each transfer transistor being connected to one of the word lines, the drain-side select gate line, the source-side select gate line, or the dummy word line. A control circuit controls the transfer transistors to control voltages supplied to the word lines, the drain-side select gate line, the source-side select gate line, and the dummy word line.

The drain-side select gate line and source-side select gate line are supplied with a voltage from the control circuit through the transfer transistors that are rendered conductive when corresponding one of the memory blocks is selected. On the other hand, the drain-side select gate line and source-side select gate line are set in a floating state by the transfer transistors that are rendered non-conductive when corresponding one of the memory blocks is not selected.

The dummy word line is supplied with a voltage from the control circuit through a first transfer transistor that are rendered conductive when corresponding one of the memory blocks is selected. On the other hand, the dummy word line is supplied with a voltage through a second transfer transistor different from the first transfer transistor when corresponding one of the memory blocks is not selected. Referring now to the drawings, a non-volatile semiconductor memory device according to the embodiments of the present invention will be described.

First Embodiment

Configuration

First, referring to FIG. 1, the entire configuration of a non-volatile semiconductor memory device according to a first embodiment will be described. FIG. 1 is a circuit diagram of the non-volatile semiconductor memory device according to the first embodiment.

With reference to FIG. 1, the non-volatile semiconductor memory device according to the first embodiment includes a memory cell array AR1 and a control circuit AR2 provided in the periphery thereof.

With reference to FIG. 1, the memory cell array AR1 includes a plurality of memory strings MS. Each memory string MS includes electrically rewritable memory transistors MTr1 to MTr8 (memory cells) connected in series. The control circuit AR2 includes various control circuits for controlling voltages applied to the gates of the memory transistors MTr (MTr1 to MTr8) or the like.

The control circuit AR2 performs a write operation of writing data to the memory transistor MTr, an erase operation of erasing data of the memory transistor MTr, and a read operation of reading data from the memory transistor MTr. In the write operation and the read operation, the selected memory string MS is applied with a voltage generally the same as that in a conventional stacked flash memory.

With reference to FIG. 1, the memory cell array AR1 includes, by way of example, m columns of memory blocks MB. Further, each memory block MB includes, by way of example, memory units MU arranged in n rows and 2 columns. Each memory unit MU includes a memory string MS, a source-side select transistor SSTr connected to a first end of the memory string MS, and a drain-side select transistor SDTr connected to a second end of the memory string MS. Both end memory transistors in the memory string MS are dummy transistors DMTrd and DMTrs not used for the data storage. The dummy memory transistors DMTrd and DMTrs may have the same structure as the memory transistor MTr.

Note that in the example shown in FIG. 1, the first column of the memory unit MU is depicted as (1), and the second column is depicted as (2). Bit lines BL and source lines SL are shared by the m column of memory block MB.

Figure 2:
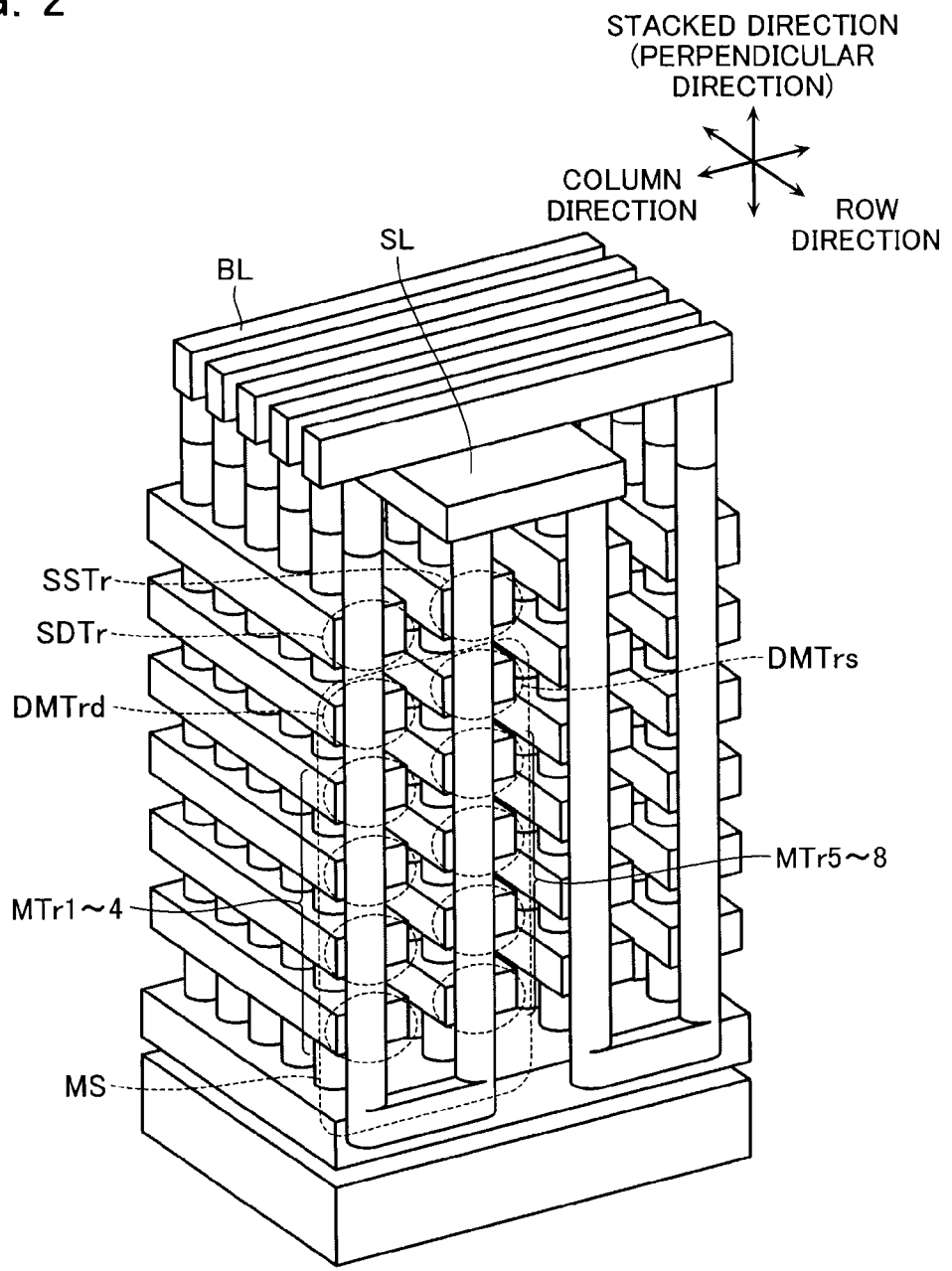
FIG. 2 is a perspective view showing a specific configuration of the memory cell array AR1.

With reference to FIG. 2, the memory cell array AR1 includes the memory transistors MTr, which electrically store data, arranged in a three-dimensional matrix. Specifically, the memory transistors MTr are arranged in a matrix in the horizontal direction, and are also arranged in the stacking direction (in a direction perpendicular to the substrate). The memory transistors MTr and the dummy transistors DMTrd and DMTrs arranged in the stacking direction are connected in series to form the memory string MS. The ends of the memory string MS are respectively connected to the drain-side select transistor SDTr and the source-side select transistor SSTr, which are rendered conductive when selected. The memory strings MS are arranged having a longitudinal direction in the stacking direction. The detailed stacked structure will be described later.

Figure 3:
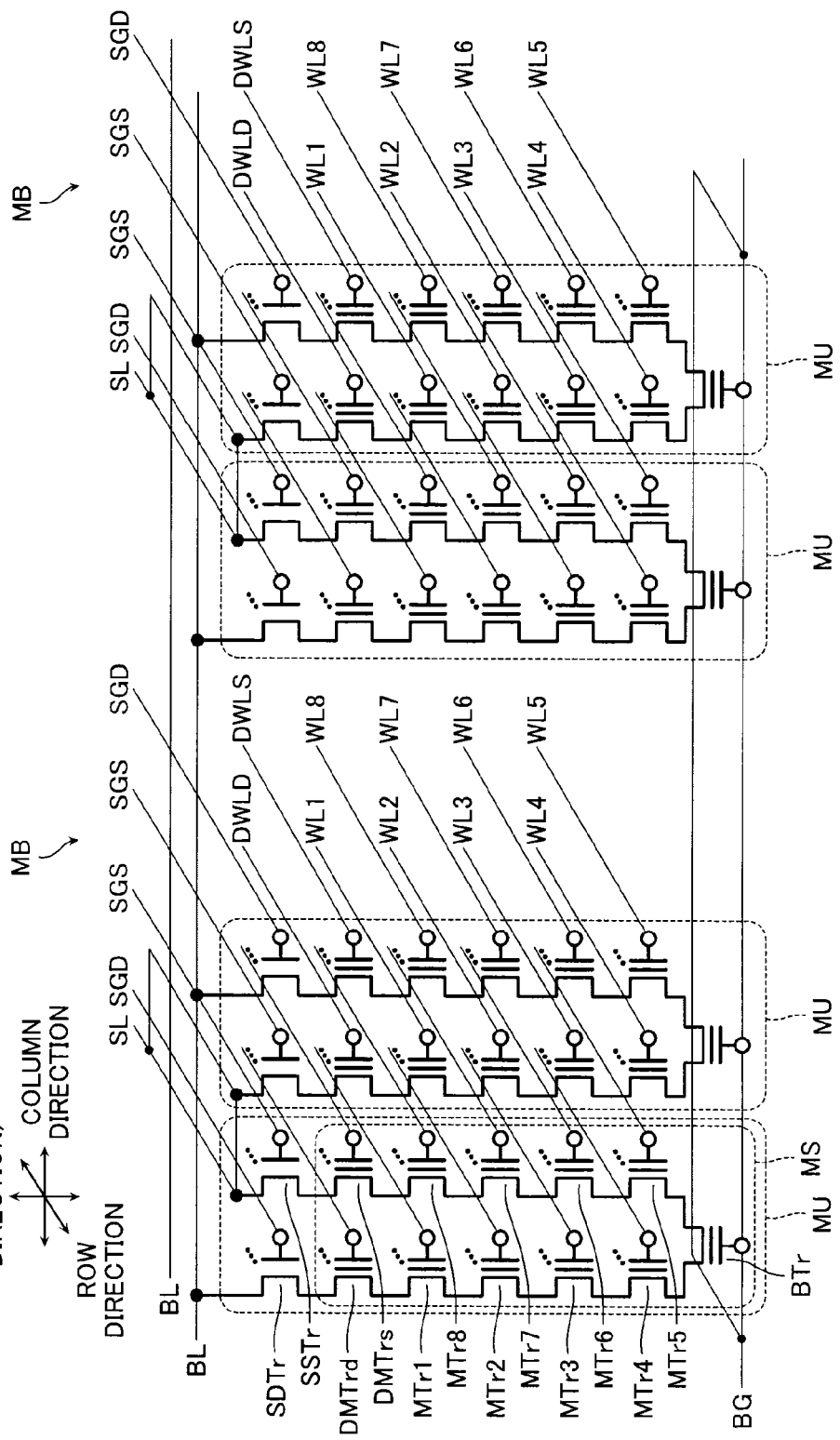
FIG. 3 is an equivalent circuit diagram of a memory block MB.

Referring now to FIG. 3, the circuitry of the memory cell array AR1 will be specifically described. FIG. 3 is an equivalent circuit diagram of the memory cell array AR1.

With reference to FIG. 3, the memory cell array AR1 includes a plurality of bit lines BL and a plurality of memory blocks MB. The bit lines BL are formed in a stripe pattern that has a predetermined pitch in the row direction and extends in the column direction. The memory blocks MB are repeatedly provided in the column direction at a predetermined pitch.

With reference to FIG. 3, each memory block MB includes the memory units MU arranged in a matrix in the row and column directions. In each memory block MB, one bit line BL is provided with the memory units MU commonly connected thereto. Each memory unit MU includes the memory string MS, the source-side select transistor SSTr, and the drain-side select transistor SDTr. The memory units MU adjacent in the column direction are formed such that their configurations are symmetrical to each other in the column direction. The memory units MU are arranged in a matrix in the row and column directions.

Each memory string MS includes the memory transistors MTr1 to MTr8 connected in series and a back gate transistor BTr. The memory transistors MTr1 to MTr4 are connected in series in the stacking direction. The memory transistor MTr5 to MTr8 are also connected in series in the stacking direction. Each of the memory transistors MTr1 to MTr8 stores information by changing the amount of charge accumulated in a charge accumulation layer to change the threshold voltage of the transistor. The back gate transistor BTr is connected between the memory transistor MTr4 and the memory transistor MTr5 in the bottom layer. Therefore, the memory transistors MTr1 to MTr8 and the back gate transistor BTr are connected in a U shape in a cross-section in the column direction. The drain-side select transistor SDTr has a source connected to a first end of the memory string MS. The source-side select transistor SSTr has a drain connected to a second end of the memory string MS.

In the memory units MU, the gates of the memory transistors MTr1 aligned in the row direction are commonly connected to a word line WL1 extending in the row direction. Similarly, the gates of the memory transistors MTr2 to MTr8 aligned in the row direction are commonly connected to word lines WL2 to WL8 extending in the row direction. Note that two memory strings MS adjacent in the column direction also share the word lines WL1 to WL8. Further, the gates of the back gate transistors BTr arranged in a matrix in the row and column directions are commonly connected to a back gate line BG.

In the memory units MU, the gates of the drain-side select transistors SDTr aligned in the row direction are commonly connected to a drain-side select gate line SGD extending in the row direction. Further, the drains of the drain-side select transistors SDTr aligned in the column direction are commonly connected to a bit line BL extending in the column direction.

In the memory units MU, the gates of the source-side select transistors SSTr aligned in the row direction are commonly connected to a source-side select gate line SGS extending in the row direction. Further, in one memory block, the sources of the source-side select transistors SSTr are commonly connected to a source line SL extending in the row direction.

Figure 4:
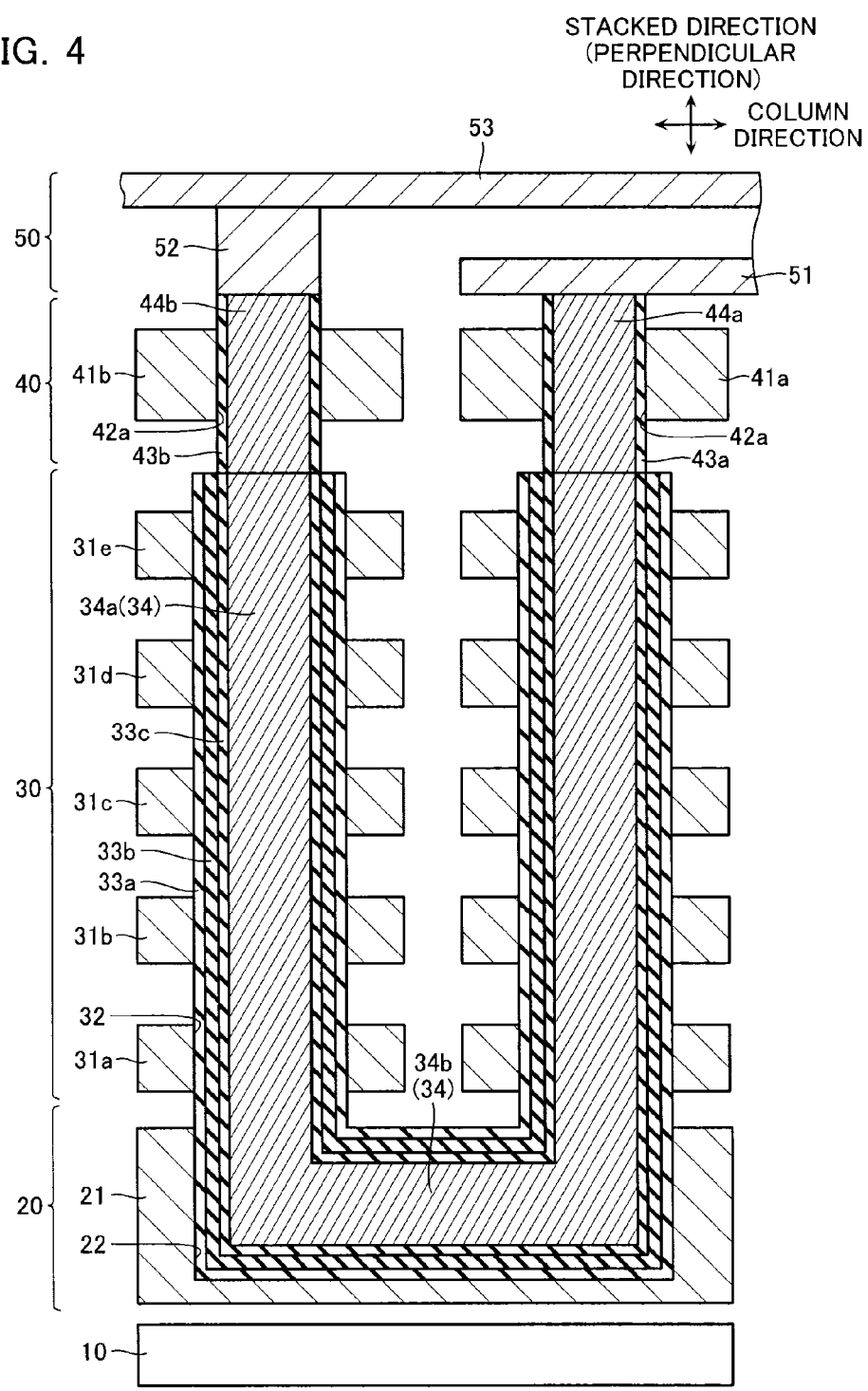
FIG. 4 is a cross-sectional view of one NAND cell unit NU.

Referring now to FIG. 4, the stacked structure of the non-volatile semiconductor memory device according to the first embodiment will be described. FIG. 4 is a partial cross-sectional view of the memory cell array AR1.

With reference to FIG. 4, the memory cell array AR1 includes, on a substrate 10, a back gate transistor layer 20, a memory transistor layer 30, a select transistor layer 40, and a wiring layer 50.

The back gate transistor layer 20 functions as the back gate transistors BTr. The memory transistor layer 30 functions as the memory transistors MTr1 to MTr8 and the dummy transistors DMTrd and DMTrs. The select transistor layer 40 functions as the source-side select transistors SSTr and the drain-side select transistors SDTr. The wiring layer 50 functions as the source lines SL and the bit lines BL.

With reference to FIG. 4, the back gate transistor layer 20 includes a back gate conductive layer 21. The back gate conductive layer 21 functions as the back gate lines BG. Further, the back gate conductive layer 21 functions as the gates of the back gate transistors BTr.

The back gate conductive layer 21 is formed extending two-dimensionally in the row and column directions parallel with the substrate. The back gate conductive layer 21 is divided for each memory block MB. The back gate conductive layer 21 is formed of polysilicon (poly-Si).

With reference to FIG. 4, the back gate transistor layer 20 includes a back gate hole 22. The back gate hole 22 is formed trimming the back gate conductive layer 21. The back gate hole 22 is formed in a generally rectangular shape having a longitudinal direction in the column direction when viewed in a top plan view. A plurality of back gate holes 22 are formed in a matrix in the row and column directions.

With reference to FIG. 4, the memory transistor layer 30 is formed in an upper layer over the back gate transistor layer 20. The memory transistor layer 30 includes word line conductive layers 31a to 31e. The word line conductive layers 31a to 31e function as the word lines WL1 to WL8 and the dummy word lines DWLD and DWLS.

The word line conductive layers 31a to 31d are stacked via interlayer insulating layers (not shown) therebetween. The word line conductive layers 31a to 31e have a predetermined pitch in the column direction and extend in the row direction over a predetermined region. The word line conductive layers 31a to 31e are formed of polysilicon (poly-Si).

With reference to FIG. 4, the memory transistor layer 30 includes memory holes 32. The memory holes 32 are formed passing through the word line conductive layers 31a to 31e and the interlayer insulating layers (not shown) therebetween.

The memory holes 32 are formed being aligned with the vicinities of the end portions in the column direction of the back gate hole 22.

Further, with reference to FIG. 4, the back gate transistor layer 20 and the memory transistor layer 30 each include a block insulating layer 33a, a charge accumulation layer 33b, a tunnel insulating layer 33c, and a U shape semiconductor layer 34. The block insulating layer 33a, the charge accumulation layer 33b, and the tunnel insulating layer 33c function as a block insulating film, a charge accumulation film, and a tunnel insulating film, respectively, of the memory transistors MTr1 to MTr8. Further, the U shape semiconductor layer 34 functions as the bodies (channel region) of the memory transistors MTr1 to MTr8.

With reference to FIG. 4, the block insulating layer 33a is formed on the side wall of the back gate hole 22 and memory hole 32 with a predetermined thickness. The charge accumulation layer 33b is formed on the side surface of the block insulating layer 33a with a predetermined thickness. The tunnel insulating layer 33c is formed on the side surface of the charge accumulation layer 33b with a predetermined thickness. The U shape semiconductor layer 34 is formed in contact with the side surface of the tunnel insulating layer 33c. The U shape semiconductor layer 34 is formed filling the back gate hole 22 and the memory hole 33. The U shape semiconductor layer 34 is formed in a U shape when viewed in the row direction. The U shape semiconductor layer 34 includes a pair of columnar portions 34a extending in a direction perpendicular the substrate 10, and a coupling portion 34b coupling the lower ends of the pair of columnar portions 34a.

The block insulating layer 33a and tunnel insulating layer 33c are formed of silicon dioxide ($SiO_2$). The charge accumulation layer 33b is formed of silicon nitride (SiN). The U shape semiconductor layer 34 is formed of polysilicon (poly-Si).

With reference to FIG. 4, the select transistor layer 40 includes a source-side conductive layer 41a and a drain-side conductive layer 41b. The source-side conductive layer 41a functions as the source-side select gate lines SGS. Further, the source-side conductive layer 41a functions as the gates of the source-side select transistors SSTr. The drain-side conductive layer 41b functions as the drain-side select gate lines SGD. Further, the drain-side conductive layer 41b function as the gates of the drain-side select transistors SDTr.

The source-side conductive layer 41a and the drain-side conductive layer 41b are formed in a stripe pattern that has a predetermined pitch in the column direction and extends in the row direction. The pair of source-side conductive layers 41a and the pair of drain-side conductive layers 41b are alternately disposed in the column direction. The source-side conductive layer 41a is formed in an upper layer over a first columnar portion 34a included in the U shape semiconductor layer 34. The drain-side conductive layer 41b is formed in an upper layer over a second columnar portion 34a included in the U shape semiconductor layer 34. The source-side conductive layer 41a and the drain-side conductive layer 41b are formed of polysilicon (poly-Si).

With reference to FIG. 4, the select transistor layer 40 includes a source-side hole 42a and a drain-side hole 42b. The source-side hole 42a is formed passing through the source-side conductive layer 41a. The source-side hole 42a is formed in a position aligned with the memory holes 32. The drain-side hole 42b is formed passing through the drain-side conductive layer 41b. The drain-side hole 42b is formed in a position aligned with the memory holes 32.

With reference to FIG. 4, the select transistor layer 40 includes a source-side gate insulating layer 43a, a source-side columnar semiconductor layer 44a, a drain-side gate insulating layer 43b, and a drain-side columnar semiconductor layer 44b. The source-side columnar semiconductor layer 44a functions as the bodies of the source-side select transistors SSTr. Drain-side columnar semiconductor layer 44b functions as the bodies of the drain-side select transistors SDTr.

The source-side gate insulating layer 43a is formed on the side wall of the source-side hole 42a. The source-side columnar semiconductor layer 44a is formed in contact with the source-side gate insulating layer 43a, and is also formed in a columnar shape extending in a direction perpendicular to the substrate 10. The drain-side gate insulating layer 43b is formed on the side wall of the drain-side hole 42b. The drain-side columnar semiconductor layer 44b is formed in contact with the drain-side gate insulating layer 43b, and is also formed in a columnar shape extending in a direction perpendicular to the substrate 10.

The source-side gate insulating layer 43a and the drain-side gate insulating layer 43b are formed of silicon dioxide ($SiO_2$). The source-side columnar semiconductor layer 44a and the drain-side columnar semiconductor layer 44b are formed of polysilicon (poly-Si).

With reference to FIG. 4, the wiring layer 50 is formed in an upper layer over the select transistor layer 40. The wiring layer 50 includes a source line layer 51, a plug layer 52, and a bit line layer 53. The source line layer 51 functions as the source lines SL (first source lines SLA). The bit line layer 53 functions as the bit lines BL.

The source line layer 51 is formed in a plate extending in the row direction. The source line layer 51 is formed in contact with the top surface of the pair of source-side columnar semiconductor layers 44a adjacent in the column direction. The plug layer 52 is formed in contact with the top surface of the drain-side columnar semiconductor layer 44b and is also formed extending in a direction perpendicular to the substrate 10. The bit line layer 53 is formed in a stripe pattern that has a predetermined pitch in the row direction and extends in the column direction. The bit line layer 53 is formed in contact with the top surface of the plug layer 52. The source line layer 51, the plug layer 52, and the bit line layer 53 are formed of metal such as tungsten (W).

Figure 5:
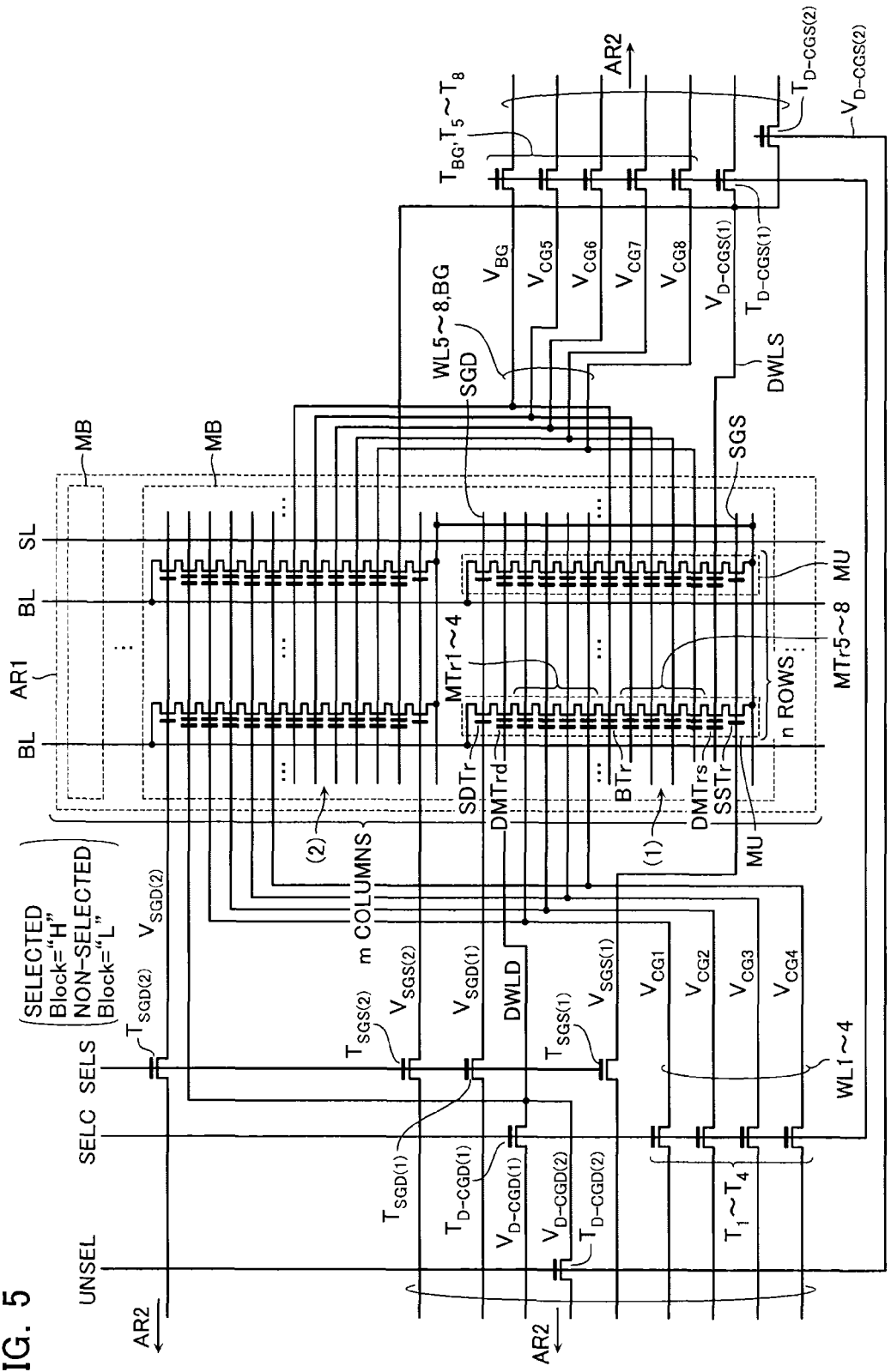
FIG. 5 illustrates a transfer transistor in a control circuit AR2.

FIG. 5 shows a configuration of the transfer transistors included in the control circuit AR2. These transfer transistors are rendered conductive at a predetermined timing to be supplied with voltages necessary for the various operations from the control circuit AR2. The non-volatile semiconductor memory device according to this embodiment includes such transfer transistors, thereby allowing the appropriate performance of the various operations while reducing the number of transfer transistors for reduction of the circuit area of the peripheral circuits.

One drain-side select gate line SGD is connected to a single transfer transistor $T_{SGD}$ ($T_{SGD}(1)$ or $T_{SGD}(2)$). Thus, by switching the transfer transistor $T_{SGD}$ between the conductive state and the non-conductive state, the drain-side select gate line SGD is switched between a state in which it is supplied with a fixed voltage and the floating state.

Similarly, one source-side select gate line SGS is connected to a single transfer transistor $T_{SGS}$ ($T_{SGS}(1)$ or $T_{SGS}(2)$). Thus, by switching the transfer transistor $T_{SGS}$ between the conductive state and the non-conductive state, the source-side select gate line SGS is switched between a state in which it is supplied with a fixed voltage and the floating state.

In this way, in this embodiment, one select gate line SGD is connected to one transfer transistor. The same holds true for the select gate line SGS. One memory block MB includes the select gate lines SGD and SGS depending on the number of sub-blocks. Each select gate line needs to be independently voltage controlled. Thus, one select gate line SGD or SGS may be connected to one transfer transistor, thereby reducing the area of the peripheral circuits. Instead, in this embodiment, one dummy word line DWLD or DWLS is connected to two transfer transistors, as described below.

Note that the transfer transistors $T_{SGD}(1)$, $T_{SGD}(2)$, $T_{SGS}(1)$, and $T_{SGS}(2)$ are conduction controlled by a control signal SELS. The control signal SELS changes to "H" when the corresponding block MB is selected, and changes to "L" when the corresponding block MB is not selected.

Further, the word lines WL1 to WL8, the dummy word lines DWLD and DWLS, and the back gate line BG are connected to transfer transistors T1 to T8, TD-CGD, TD-CGS, and TBG, respectively. The transfer transistors T1 to T8, $T_{D-CGD(1)}$, TD-CGS(1), and TBG are all conduction controlled by a control signal SELC. The control signal SELC is a signal that changes to "H" when the corresponding memory block MB is selected and before a predetermined operation is started.

In addition, the dummy word lines DWLD and DWLS are also connected to the respective transfer transistors $T_{D-CGD(2)}$ and $TD-_{CGS(2)}$. The transfer transistors $T_{D-CGD(2)}$ and $TD-_{CGS(2)}$ are conduction controlled by a control signal UNSEL. The control signal UNSEL is a signal that changes to "H" when the corresponding memory block MB is not selected.

Figures 6, 7:
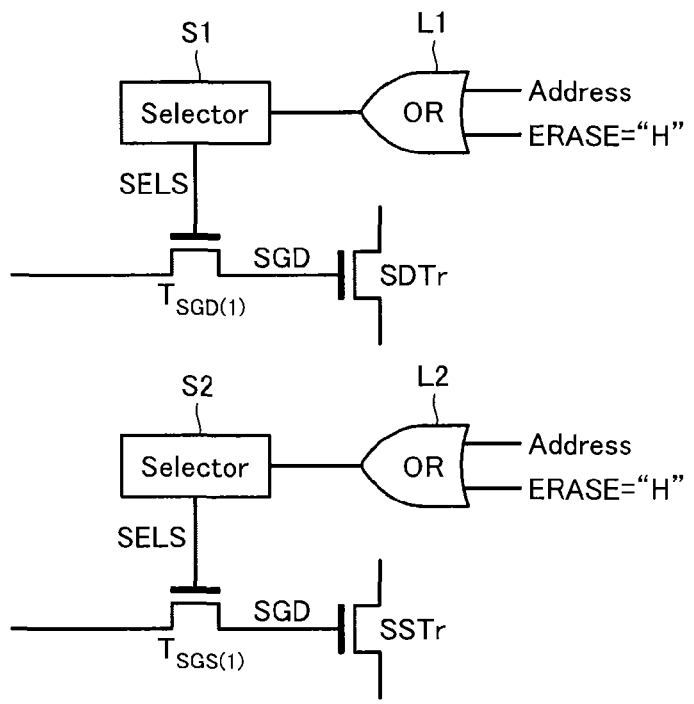
FIG. 6 illustrates an operation according to the first embodiment.
FIG. 7 illustrates a configuration according to a second embodiment.

Referring now to FIG. 6, an operation according to this embodiment will be described. FIG. 6 shows the amount of voltage supplied to each wiring line of a selected block MB and a non-selected block MB when the memory block is selected/not selected, for the read operation (Read), the write operation (Program), and the erase operation (Erase). Note that in FIG. 6, the "f" means the floating state. The floating state is provided by maintaining the corresponding transfer transistor in the non-conductive state.

The operation will be described below for different situations.

(1) Voltage Applied To Selected Memory Block Mb In Read Operation

First, a description is given of a voltage applied to the selected memory block MB in the read operation of the selected memory block. The bit lines BL are provided with a voltage of about 3 V, and the source lines SL are provided with the ground voltage Vss (0 V). Further, the control signal SELS changes to "H," which renders the transfer transistors $T_{SGD}$ and $T_{SGS}$ conductive. Then, the control circuit AR2 transfers, via these transfer transistors, voltages $V_{SGD}=V_{SGS}=3$ V or 0 V to the select gate lines SGD and SGS (3 V to the selected NAND cell unit and 0 V to the non-selected NAND cell unit).

Furthermore, voltages $V_{D-CGD}$ and $V_{D-CGS}$ provided to the dummy word lines DWLD and DWLS are set to a read pass voltage Vread (for example 5 V to 6 V). The read pass voltage Vread is a voltage that has an amount enough to allow rendering the memory transistor MTr conductive regardless of the held data.

In addition, voltages $V_{CG}$ and $V_{BG}$ provided to the word lines WL and the back gate lines BG are set to a voltage Vcgrv or the Vread. The voltage Vcgrv is a voltage between the upper limit and the lower limit of the threshold voltage distributions of the memory transistor MTr. When the multi-level storage scheme is used, the voltage Vcgrv may take various values.

(2) Voltage Applied To Selected Memory Block Mb In Write Operation

Next, a description is given of a voltage applied to the selected memory block MB in the write operation of the selected memory block MB. The bit lines BL are applied with 3 V when data being written is "1" (for the write inhibit), and applied with the ground voltage Vss (0 V) when data is "0." The source lines SL are provided with the ground voltage Vss.

Further, the control signal SELS changes to "H," which renders the transfer transistors $T_{SGD}$ and $T_{SGS}$ conductive. Then, the control circuit AR2 transfers, via these transfer transistors, the voltage $V_{SGD}=3$ V or 0 V to the select gate line SGD (3 V to the selected NAND cell unit and 0 V to the non-selected NAND cell unit), and the select gate line SGS is applied with the voltage $V_{SGS}=0$ V.

Further, the voltages $V_{D-CGD}$ and $V_{D-CGS}$ provided to the dummy word lines DWLD and DWLS are set to a write pass voltage Vpass (for example, 10 to 12V). The write pass voltage Vpass is a voltage that has an amount enough to allow rendering the memory transistor MTr conductive regardless of the held data without varying the threshold voltage of the memory transistor MTr.

Further, the voltage $V_{CG}$ provided to the word lines WL is set to a programming voltage Vpgm (=about 20 V to 22 V) that may vary the threshold voltage or the write pass voltage Vpass.

(3) Voltage Applied To Selected Memory Block Mb In Erase Operation

Next, a description is given of a voltage applied to the selected memory block MB in the erase operation. The bit lines BL and the source lines SL are applied with an erase voltage Vera having an amount of about 15 V.

Further, the control signal SELS changes to "H," which renders the transfer transistors $T_{SGD}$ and $T_{SGS}$ conductive. Then, the control circuit AR2 transfers, via these transfer transistors, the voltage $V_{SGD}=3$ V to the select gate lines SGD and SGS. The potential difference between the voltage of 3 V and the erase voltage Vera (about 15 V) provided to the bit lines BL and source lines SL causes a GIDL current (a Gate Induced Drain Leakage) in the drain-side select transistors SDTr and source-side select transistors SSTr, the GIDL current charging the bodies of the memory strings MS to near the erase voltage Vera.

Further, the voltages $V_{D-CGD}$ and $V_{D-CGS}$ and $V_{CG}$ provided to the dummy word lines DWLD and DWLS and the word lines WL, respectively, are set to the ground voltage Vss (0 V).

(4) Voltage Applied To Non-Selected Memory Block Mb In Read Operation of Selected Memory Block Mb Next, a description is given of a voltage applied to a non-selected memory block MB in the read operation of the selected memory block MB. Like (1), the bit lines BL are provided with a voltage of about 3 V, and the source lines SL are provided with the ground voltage Vss (0 V). Note, however, that the control signal SELS changes to "L," which renders the transfer transistors $T_{SGD}$ and $T_{SGS}$ non-conductive. Thus, the select gate lines SGD and SGS are maintained in the floating state (f).

In contrast, the control signal UNSEL changes to "H," by which the voltages $V_{D-CGD}$ and $V_{D-CGS}$ provided to the dummy word lines DWLD and DWLS are set to the ground voltage Vss. Thus, the dummy transistors DMTrd and DMTrs are maintained non-conductive. In this way, in this embodiment, the dummy word lines DWLD each include two transfer transistors $T_{D-CGD(1)}$ and $T_{D-CGD(2)}$ and one of them is rendered conductive. Thus, even if the select gate lines SGD are each controlled by the single transfer transistor $T_{SGD}$, the leak current may be effectively limited in the non-selected memory block MB, and the conventional read operation may be performed without any problems. The same holds true for the dummy word lines DWLS.

(5) Voltage Applied To Non-Selected Memory Block Mb In Write Operation of Selected Memory Block Mb Next, a description is given of a voltage applied to a non-selected memory block MB in the write operation of the selected memory block MB.

The control signal SELS changes to "L," which renders the transfer transistors $T_{SGD}$ and $T_{SGS}$ non-conductive. Thus, the select gate lines SGD and SGS are maintained in the floating state (f).

In contrast, the control signal UNSEL changes to "H," by which the voltages $V_{D\text{-}CGD}$ and $V_{D\text{-}CGS}$ provided to the dummy word lines DWLD and DWLS are set to the ground voltage Vss. Thus, the dummy transistors DMTrd and DMTrs are maintained non-conductive. Further, the word lines WL are left floating through the transfer transistors T1 to T8 rendered non-conductive.

In this way, in this embodiment, the dummy word lines DWLD each include two transfer transistors $T_{D\text{-}CGD(1)}$ and $T_{D\text{-}CGD(2)}$, and one of them is rendered conductive. Thus, even if the select gate lines SGD are each controlled by the single transfer transistor $T_{SGD}$, the conventional write operation may be performed without any problems. The same holds true for the dummy word lines DWLS.

(6) Voltage Applied To Non-Selected Memory Block Mb In Erase Operation of Selected Memory Block Mb Next, a description is given of a voltage applied to a non-selected memory block MB in the erase operation of the selected memory block MB.

The control signals SELS and SELC change to "L," which renders non-conductive the transfer transistors $T_{SGD}$ and $T_{SGS}$, TD-CGD, TD-CGS, and T1 to T8. Thus, the select gate lines SGD and SGS are kept floating. Even if the bit lines BL and source lines SL are applied with the erase voltage Vera, the select gate lines SGD and SGS increase their potentials by a capacitive coupling effect, by which the GIDL current is not caused and the erase operation is not performed. Further, the word lines WL, the back gate lines BG, and the dummy word lines DWLD and DWLS are all left floating.

Effects

As described above, in this embodiment, the select gate lines SGD and SGS each include a single transfer transistor. Thus, the circuit area of the peripheral circuits is smaller than those in the conventional technologies. Although the two transfer transistors are provided for each dummy word line DWL instead, the transfer transistors may be shared between the dummy word lines in one memory block MB. In the example in FIG. 1, four transfer transistors are enough for the select gate lines in one memory block MB. Therefore, the circuit area of the peripheral circuits may be reduced as a whole, while the various operations may be correctly performed.

Second Embodiment

Figure 8:
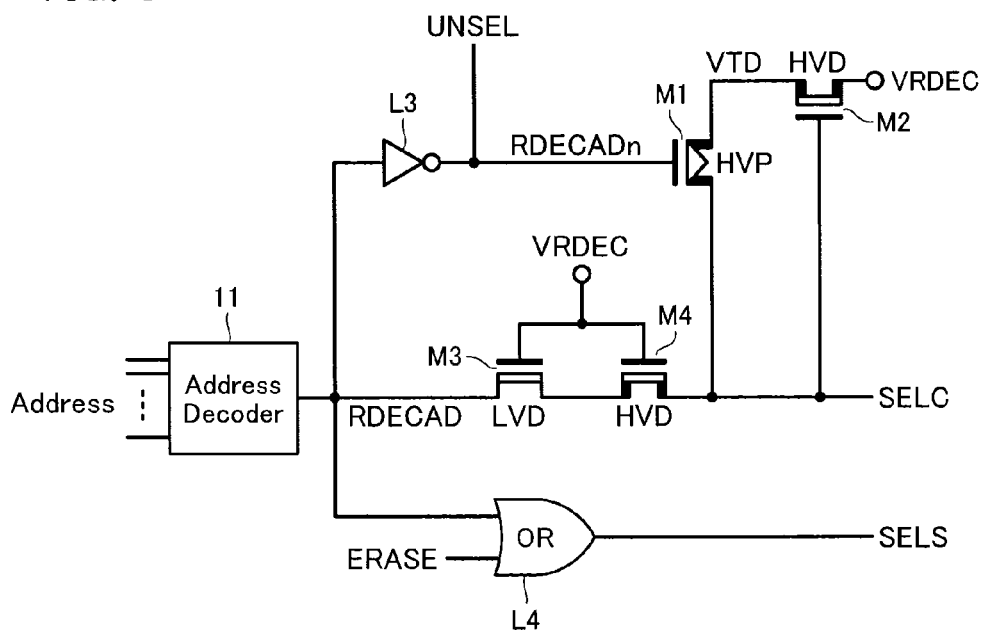
FIG. 8 illustrates a configuration according to the second embodiment.

Referring now to FIG. 7 and FIG. 8, a non-volatile semiconductor memory device according to a second embodiment will be described. The entire configuration of the non-volatile semiconductor memory device according to this embodiment is generally the same as those in FIG. 1 to FIG. 5. Note, however, that, in this embodiment, the select gate lines SGD and SGS of a non-selected memory block MB are riot set to the floating state but to a fixed voltage (for example, 3 V) in the erase operation, and so the control circuit AR2 includes a row decoder as shown in FIG. 7.

The row decoder includes logic gate circuits L1 and L2 and selector circuits S1 and S2. The logic gate circuits L1 and L2 are OR gates that each receive a signal Address changing to "H" when an assigned block address is the same as their block addresses and a signal ERASE changing to "H" when the erase operation is performed, and output the logical OR of the two signals. Further, the selector circuits S1 and S2 set the control signal SELS to "H" when the output signals from the logic gate circuits L1 and L2 are "H," respectively. Thus, even if a memory block MB is not selected, when the erase operation is performed in it, the above circuits may provide a fixed voltage (for example, 3 V) to the select gate lines SGD and SGS without setting them to the floating state.

FIG. 8 shows another example configuration of a row decoder used in the second embodiment. The configurations of the transistors M1 to M4 are the same as the well-known configuration, and their description is omitted here. The row decoder in FIG. 8 further includes a logic gate circuit L4. The logic gate circuit L4 receives an output signal from an address decoder 11 and the above signal ERASE. The output signal from the logic gate circuit L4 is the control signal SELS.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. A non-volatile semiconductor memory device comprising:
   a memory cell array including a plurality of memory blocks, the memory blocks including a first memory string and a second memory string, the first memory string including first memory transistors and a first transistor, the second memory string including second memory transistors and a second transistor;
   a first select transistor electrically connected to a first end of the first memory string;
   a second select transistor electrically connected to a first end of the second memory string;
   word lines electrically connected to gates of the first memory transistors and gates of the second memory transistors;
   a first select gate line electrically connected to a gate of the first select transistor;
   a second select gate line electrically connected to a gate of the second select transistor;
   a first line electrically connected to a gate of the first transistor and a gate of the second transistor;
   transfer transistors including a third transistor to a sixth transistor, a first end of the third transistor being electrically connected to the first select gate line, a first end of the fourth transistor being electrically connected to the second select gate line, a first end of the fifth transistor being electrically connected to the first line, and a first end of the sixth transistor being electrically connected to the first line;
a second line electrically connected to gates of the third transistor and the fourth transistor;
a third line electrically connected to a gate of the fifth transistor, the third line being different from the second line; and
a fourth line electrically connected to a gate of the sixth transistor, the fourth line being different from the second line and the third line.

2. The non-volatile semiconductor memory device according to claim 1, wherein
the fifth transistor is controlled by a first control signal, while the sixth transistor is controlled by a second control signal, the first control signal being different from the second control signal.

3. The non-volatile semiconductor memory device according to claim 1, wherein
when an erase operation is performed in a selected memory block, a first voltage is applied to gates of the third and fourth transistors in a non-selected memory block.

4. The non-volatile semiconductor memory device according to claim 3, wherein
the fifth transistor is controlled by a first control signal, while the sixth transistor is controlled by a second control signal, the first control signal being different from the second control signal.

5. The non-volatile semiconductor memory device according to claim 1, wherein
a first voltage is applied to the first select gate line and the second select gate line in a selected memory block and a second voltage is applied to the first select gate line and the second select gate line in a non-selected memory block.

6. The non-volatile semiconductor memory device according to claim 5, wherein
the fifth transistor is controlled by a first control signal, while the sixth transistor is controlled by a second control signal, the first control signal being different from the second control signal.

7. The non-volatile semiconductor memory device according to claim 1, further comprising:
a control circuit configured to apply voltages to gates of the transfer transistors,
wherein the first transistor is a first dummy transistor and the second transistor is a second dummy transistor.

8. The non-volatile semiconductor memory device according to claim 1, wherein
when an erase operation is performed in a selected memory block, a first voltage is applied to the second line in non-selected memory block, and
when an operation other than an erase operation is performed in the selected memory block, a second voltage is applied to the second line in the non-selected memory block, the first voltage being higher than the second voltage.

9. The non-volatile semiconductor memory device according to claim 1, wherein
the memory string comprises:
a columnar semiconductor layer extending in a direction perpendicular to a semiconductor substrate;
a gate insulating film surrounding the columnar semiconductor layer; and
a conductive layer surrounding the gate insulating film.

10. The non-volatile semiconductor memory device according to claim 1, wherein
the first select gate line is provided in a direction parallel to the semiconductor substrate, and
the second select gate line is provided in the direction.

11. The non-volatile semiconductor memory device according to claim 1,
further comprising:
a first selector electrically connected to the second line; and
an OR circuit electrically connected to the first selector, the OR circuit being configured to receive an address and an erase signal.

12. A non-volatile semiconductor memory device comprising:
a memory cell array comprising a plurality of memory blocks, the memory blocks including a first memory string and a second memory string, the first memory string including first memory transistors and a first transistor, the second memory string including second memory transistors and a second transistor;
a first select transistor electrically connected to a first end of the first memory string;
a second select transistor electrically connected to a first end of the second memory string;
word lines electrically connected to gates of the first memory transistors and gates of the second memory transistors;
a first select gate line electrically connected to a gate of the first select transistor;
a second select gate line electrically connected to a gate of the second select transistor;
a first line electrically connected to a gate of the first transistor and a gate of the second transistor;
transfer transistors including a third transistor to a sixth transistor, a first end of the third transistor being electrically connected to the first select gate line, a first end of the fourth transistor being electrically connected to the second gate select line, a first end of the fifth transistor being electrically connected to the first line, and a first end of the sixth transistor being electrically connected to the first line,
a second line electrically connected to gates of the third transistor and the fourth transistor;
a third line electrically connected to a gate of the fifth transistor, the third line being different from the second line; and
a fourth line electrically connected to a gate of the sixth transistor, the fourth line being different from the second line and the third line,
wherein
(i) the first select gate line and second select gate line are supplied with a voltage from a control circuit through the third and fourth transistors that are rendered conductive in a selected memory block;
(ii) the first select gate line and second select gate line are set in a floating state by the third and fourth transistors that are rendered non-conductive in a non-selected memory block; and
(iii) the first select gate line and second select gate line are supplied with a voltage from the control circuit through the third and fourth transistors that are rendered conductive in a non-selected memory block,
the first line is supplied with a voltage from the control circuit through the fifth transistor that is rendered conductive in the selected memory block, and being is supplied with another voltage through the sixth transistor, and the fifth transistor is controlled by a first control signal, while the sixth transistor is controlled by a second control signal, the first control signal being different from the second control signal.

13. The non-volatile semiconductor memory device according to claim 12, wherein
a first voltage is applied to the first select line and the second gate line in the selected memory block and a second voltage is applied to the first select gate line and the second select gate line in the non-selected memory block.

14. The non-volatile semiconductor memory device according to claim 12, wherein
the first memory string comprises:
a columnar semiconductor layer extending in a direction perpendicular to a semiconductor substrate;
a gate insulating film surrounding the columnar semiconductor layer; and
a conductive layer surrounding the gate insulating film.

15. The non-volatile semiconductor memory device according to claim 14, wherein
a first voltage is applied to the first select gate line and the second select gate line in the selected memory block and a second voltage is applied to the first select gate line and the second select gate line in the non-selected memory block.

16. The non-volatile semiconductor memory device according to claim 12, wherein
the fifth transistor and the sixth transistor are shared by a plurality of dummy word lines in one of the plurality of memory blocks.

17. The non-volatile semiconductor memory device according to claim 12, wherein
the second memory string comprises:
a columnar semiconductor layer extending in a direction perpendicular to a semiconductor substrate;
a gate insulating film surrounding the columnar semiconductor layer; and
a conductive layer surrounding the gate insulating film.

\* \* \* \* \*